United States Patent
Dorbeck et al.

(10) Patent No.: US 7,353,525 B1
(45) Date of Patent: Apr. 1, 2008

(54) RELIABLE DISK DRIVE AND METHOD

(76) Inventors: Mark A. Dorbeck, 4204 Pleasant Valley Rd., Brighton, MI (US) 48114; Frank Sykora, 20030 Horseshoe Hill Road, Caledon, Ontario (CA) LON ICO; Ali Erdemir, 2227 Stowe Cir., Naperville, IL (US) 60564; Osman Eryilmaz, 121 Avondale Ct., Bolingbrook, IL (US) 60440

( * ) Notice: Subject to any disclaimer, the term of this patent is extended or adjusted under 35 U.S.C. 154(b) by 446 days.

(21) Appl. No.: 10/969,667

(22) Filed: Oct. 20, 2004

(51) Int. Cl.
*G11B 33/14* (2006.01)

(52) U.S. Cl. ...................................................... 720/648

(58) Field of Classification Search ...................... None
See application file for complete search history.

(56) References Cited

U.S. PATENT DOCUMENTS

| | | | |
|---|---|---|---|
| 5,202,803 A * | 4/1993 | Albrecht et al. | 360/97.02 |
| 5,624,725 A * | 4/1997 | Nelson et al. | 428/827 |
| 6,028,750 A * | 2/2000 | Ohtsubo | 360/126 |
| 6,548,173 B2 | 4/2003 | Erdemir et al. | |
| 6,619,847 B1 * | 9/2003 | Ishikawa et al. | 384/100 |
| 6,831,811 B1 * | 12/2004 | Andrikowich et al. | 360/97.02 |
| 6,900,957 B2 * | 5/2005 | Gillis et al. | 360/69 |
| 6,961,213 B2 * | 11/2005 | Ameen et al. | 360/99.08 |
| 2003/0053262 A1 * | 3/2003 | Clayton et al. | 360/266.6 |
| 2004/0021984 A1 * | 2/2004 | Dai et al. | 360/122 |
| 2005/0117257 A1 * | 6/2005 | Thaveeprungsriporn et al. | 360/246 |

FOREIGN PATENT DOCUMENTS

JP   2001027245 A  *  1/2001

* cited by examiner

*Primary Examiner*—Allen Cao
(74) *Attorney, Agent, or Firm*—Alex Rhodes

(57) ABSTRACT

A durable, reliable high performance drive and method for digitizing, storing and retrieving data from a disk. In a first embodiment, at least one disk and components for spinning the disk, and digitizing, writing and reading data from the disk are covered with a 0.1 to 4 microns thick ultra low friction and wear, structurally amorphous carbon coating eliminating the need for a lubricant for sliding and rotating components. In a second embodiment the components for spinning the disk, and digitizing, writing and reading data from the disk are enclosed in a hermetically sealed housing and the housing is filled with a mixture of hydrogen and an inert gas.

31 Claims, 5 Drawing Sheets

Figure 4

RELIABLE DISK DRIVE AND METHOD

FIELD OF THE INVENTION

This invention relates to digital storage devices and more particularly to a reliable, high performance magnetic, optical or magnetic-optical storage drive.

BACKGROUND OF THE INVENTION

Disk drives store digitized data on disks, commonly referred to as platters. Although other digital storage devices, such as solid state memory devices are available, disk drives are currently the best alternative for minimum cost per megabyte and maximum speed and power. They fall into three broad categories; namely, magnetic, optical and magnetic-optical drives. Except for their methods of storing and retrieving information, the three categories share the same basic structure.

In magnetic drives data is stored (written) and retrieved (read) from magnetic fields in coatings on disks. Two types of magnetic drives are in use. In the first type, commonly referred to as hard or Winchester drives, a stack of non-removable hard disks is mounted in a housing on a common spindle and spins at a very high speed. Some housings are hermetically sealed while others are vented to the atmosphere. Adjacent to the disks are, spaced apart, inductive type magnetic heads which write and read data on to the coatings of the disks. The heads fly in unison above the rapidly spinning disks and are attached to common actuators or actuator arms.

In the second type, commonly referred to as a floppy drive, magnetic heads contact magnetic surfaces of thin flexible disks. The flexible disks are packaged inside of hard jackets. Protective liners made of non-woven fibers wipe the disks to minimize wear and abrasion of the magnetic media by removing and trapping particulate matter. The flexible disk spins at a relatively slow speed, around 300-360 rpm to limit the wear of the disk. The 3½ inch disk drive and the higher speed Zip, SuperDisk and Sony HiFD drives are examples of floppy drives.

Hard drives are manufactured to a high degree of precision and are assembled in dust free "clean rooms". The magnetic heads of the hard drives fly several micro inches above the disks on air bearings, generated by the rapid spinning of the disks. Flying head heights are proportional to the rotational speeds of the disks and are so minute that a single dust particle or fingerprint can disable a drive. The demands of a competitive marketplace have continuously increased storage capacities and have increased disk rotational speeds to 7200 rpm and above. The high disk rotational speeds have required fluidized bearings in hard drive and other motors to reduce friction. When a disk speed falls below its design limit, there is a danger of a head crash (contact) with a disk and or excessive head/disk wear. High disk speeds increase disk spindle and head wear and cause undesirable vibrations.

Although flying height is not a problem with floppy drives, head and disk wear are obvious concerns with magnetic and optical drives.

CD-ROM, DVD and DVD R/W drives are exemplary of optical disk drives. The storage capacity of optical drives is considerably greater than the magnetic disk drives. Digital information is written by laser beams in patterns of bumps and flats or patterns of reflective and non-reflective areas and read by reflecting laser beams off the digitized media to detectors. Most optical drives are not sealed and utilize a single one side digitized surface of a disk. Some optical drives are available with multiple disks mounted on carousels and optical drives are available with double-sided disks in sealed cartridges. The double-sided disks are manually flipped to read both sides. The third category, magnetic-optical drives, incorporate both magnetic and optical technologies.

Although air temperature, pressure, high humidity and condensation problems with magnetic hard drives have been largely eliminated by employing sealed magnetic hard drives, contamination and wear continue to limit the utility of magnetic and optical drives. It is generally accepted that all drives ultimately fail and computer users are urged to back up data on hard magnetic drives with files on floppy or CD disks. Drive failures are unpredictable and can be catastrophic because of their effects on computer controlled processes and/or losses of important data. Drive failures can be costly because of interruptions of procedures, such as data processing, accounting, etc.

Drive stiction and friction deteriorate drive performance. It has been observed that most disk and slider wear occurs below the take off speeds in hard disk drives. (See "Bhushan, B., Tribology and Mechanics of Magnetic Storage Devices", Springer-Verlag, New York, 1996, pg. 474) Stiction also increases the loading of spindle and stepper motors. Stiction and friction also accelerate drive and disk wear and can produce hard drive crashes. Chemical contamination and corrosion degrade drive magnetic performance and cause mechanical as well as electronic component failures. Reduced magnetic performance can increase soft error rates.

Harmful contaminants include dust and small abrasive particles, chemical vapors, adhesives and lubricant and organic contaminant films. Outgassings of adhesives, plastic and rubber materials are known to produce corrosive chemical vapors.

A recent study, published in the *STLE Tribology Transactions* (Vol. 47, No. 1/January-April 2004, pp. 103-110) identified liquid like, highly viscous scattering sites in disk drives. The scattering sites, referred to as cloud condensation nuclei (CCN), are comprised of nanodroplet size hygroscopic inorganic salts and low molecular weight polar organic compounds. Smears of CCN nanodroplets on disk drive heads were common to a variety of drive lubricants and adversely affected the acoustic emissions (AE) and friction of the drives.

U.S. Pat. No. 6,548,173, incorporated herein by reference, discloses an ultra low friction (sometimes referred to herein as a near frictionless carbon "NFC" coating) and ultra low wear amorphous carbon diamond-like coating. Diamond, diamond-like and amorphous carbon coatings are known in the art for resisting mechanical wear, abrasion and chemical corrosion. They can be deposited on substrate materials by chemical vapor deposition processes at temperatures ranging from 700-1000° C.

Although the previous known carbon and diamond-like coatings are very hard and abrasion resistant, they contain large diamond grains and/or their non-diamond precursor materials between grains are very rough. When used in machining or under sliding wear conditions, they produce high frictional losses and severe wear on initial mating surfaces. The amorphous carbon and diamond-like coating in U.S. Pat. No. 6,548,173 is extremely smooth, has a high hardness and is resistant to corrosion. It is electrically insulating, and optically transparent to visible infrared and ultraviolet light. It is very low in friction and has a high resistance to wear. Friction tests at the Argonne National Laboratory of the patented amorphous carbon coating in an inert gas atmosphere showed an ultra low friction coefficient within a range of 0.001 to 0.007. The lower 0.001 value is about 20 to 100 times better than a Teflon or a polished fine grain diamond coating. Another benefit of the amorphous carbon coating is that it can be deposited at much lower temperatures (150° C.-500° C.) on a variety of substrates, including metals, ceramics, polymers, and plastics.

The results of the Argonne National Laboratory tests are shown in FIGS. 4 through 6. In FIG. 4, a brief CSEM (pin on disk friction) test was performed to illustrate the effect of applying nitrogen gas to the interface of a small diameter ball and a rotating disk in a small enclosed environment. Both ball and disk were coated with a near frictionless coating NFC6. At a 120 m point on the x-axis, nitrogen gas was applied through a small diffuser as friction increased throughout a purge phase. Friction increased up to a 700 m point (Part 2) where the gas (concentration) was available in sufficient quantity to cause the friction to drop dramatically to 0.04. Nitrogen gas was temporarily turned off at a 1200 m point (Part 3) to show the negative effect of no nitrogen. At a 1300 m point (Part 4) the nitrogen gas was reapplied and friction once again dropped quickly to 0.04 at which point the gas was turned off.

Additional Argonne National Laboratory test results of the NFC coating are shown in FIGS. 5 and 6. In the FIG. 5 test, an NFC coated Sapphire ball was run against an NFC coated disk. The test results revealed that the coefficient of friction of the NFC coating is ultra-low in a 100% dry nitrogen environment. In the FIG. 6 test, an NFC pin was run on an NFC disk. The test revealed a substantial difference in the coefficients of friction in dry air versus dry nitrogen.

SUMMARY OF THE INVENTION

The present invention is an apparatus and method for overcoming contamination and wear problems with magnetic and optical disk drives. As used herein, expressions, such as "disk drive apparatus" and "disk storage drives" are intended to mean all types of magnetic, optical and magnetic-optical disk storage drives, including, but not limited to, hard disk drives, floppy disk drives, zip drives, CD-ROM drives, DVD drives and DVD-RW drives.

It is an object of the present invention to provide a durable and reliable high performance disk drive. It is a further object, in addition to the preceding object, to provide a method for improving the durability, performance and reliability of a disk drive apparatus. It is a further object, in addition to the preceding objects, to reduce the friction between mating surfaces of a disk drive apparatus. It is a still further object, in addition to the preceding objects, to increase the disk speeds and reduce the seek times of disk drives. It is a still further object, in addition to the preceding objects, to reduce or eliminate the use of lubricants in disk drives. It is a still further object, in addition to the preceding objects, to eliminate the requirement of fluidized bearings in disk drive and other motors.

The invention resides in its ability to resist abrasion and prevent cloud condensation nuclei (CCN nanodroplets), particle contaminants, chemical corrosion, wear and friction in a disk drive apparatus. The objects of the invention are accomplished by applying a thin film of an ultra low friction and wear amorphous carbon diamond-like coating to one or both mating movable surfaces in a disk drive apparatus and/or hard and floppy disks, hermetically sealing a housing of a hard disk drive or a sealed disk cartridge, purging the hard disk housing or sealed disk cartridge of moisture and air and filling the hard disk housing or sealed cartridge with a mixture of nitrogen and hydrogen. The mixture of gases within the sealed housing provides permanent lubrication within a self replenishing environment.

In employing the teaching of the present invention, a plurality of alternate constructions can be provided to achieve the desired results and capabilities. In this disclosure, some alternate constructions are discussed. However, these embodiments are intended as examples and should not be considered as limiting the scope of our invention.

Further objects, benefits and characterizing features of the invention will become apparent from the ensuing detailed description and drawings which illustrate and describe the invention. The best mode which is contemplated in practicing the invention together with the manner of using the invention are disclosed and the property in which exclusive rights are claimed is set forth in each of a series of numbered claims at the conclusion of the detailed description.

BRIEF DESCRIPTION OF THE DRAWINGS

The invention will be better understood and further objects, characterizing features, details and advantages thereof will appear more clearly with reference to the diagrammatic drawings illustrating a presently preferred specific embodiment of the invention by way of non-limiting example only.

DETAILED DESCRIPTION OF A PREFERRED EMBODIMENT

Figure 1:
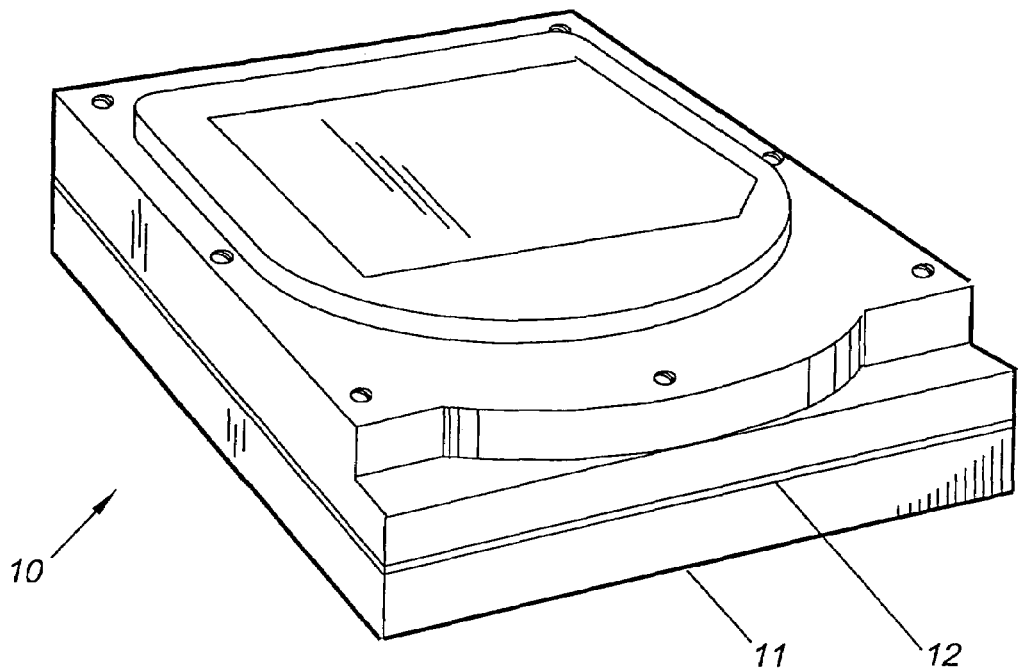
FIG. 1 is a perspective view of a hermetically sealed magnetic disk drive storage apparatus.
Figure 2:
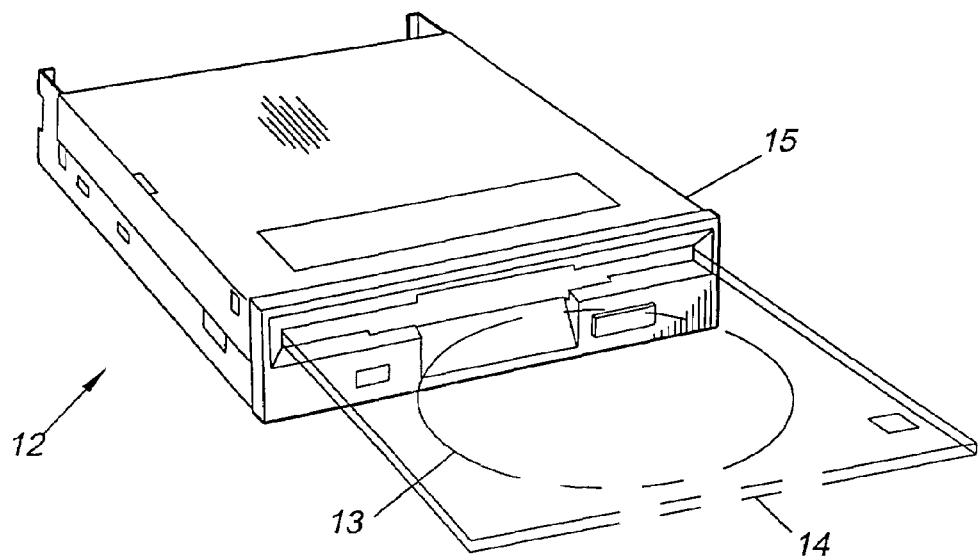
FIG. 2 is a perspective view of a magnetic floppy disk drive.
Figure 3:
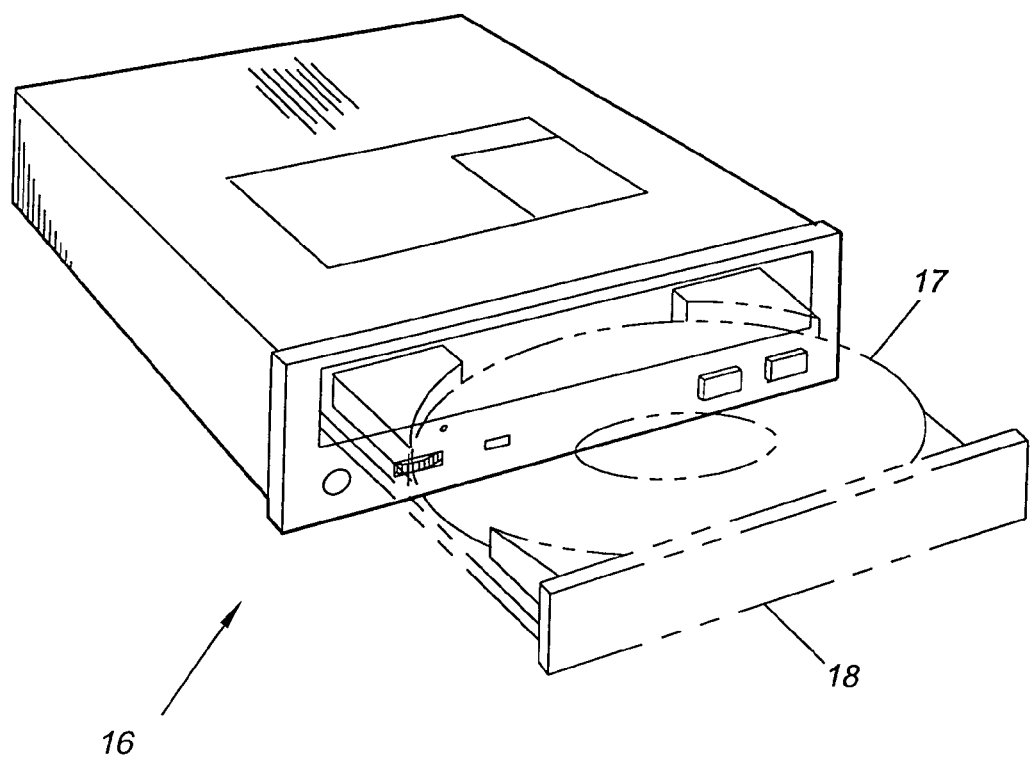
FIG. 3 is a perspective view of an optical disk drive.
Figure 4:
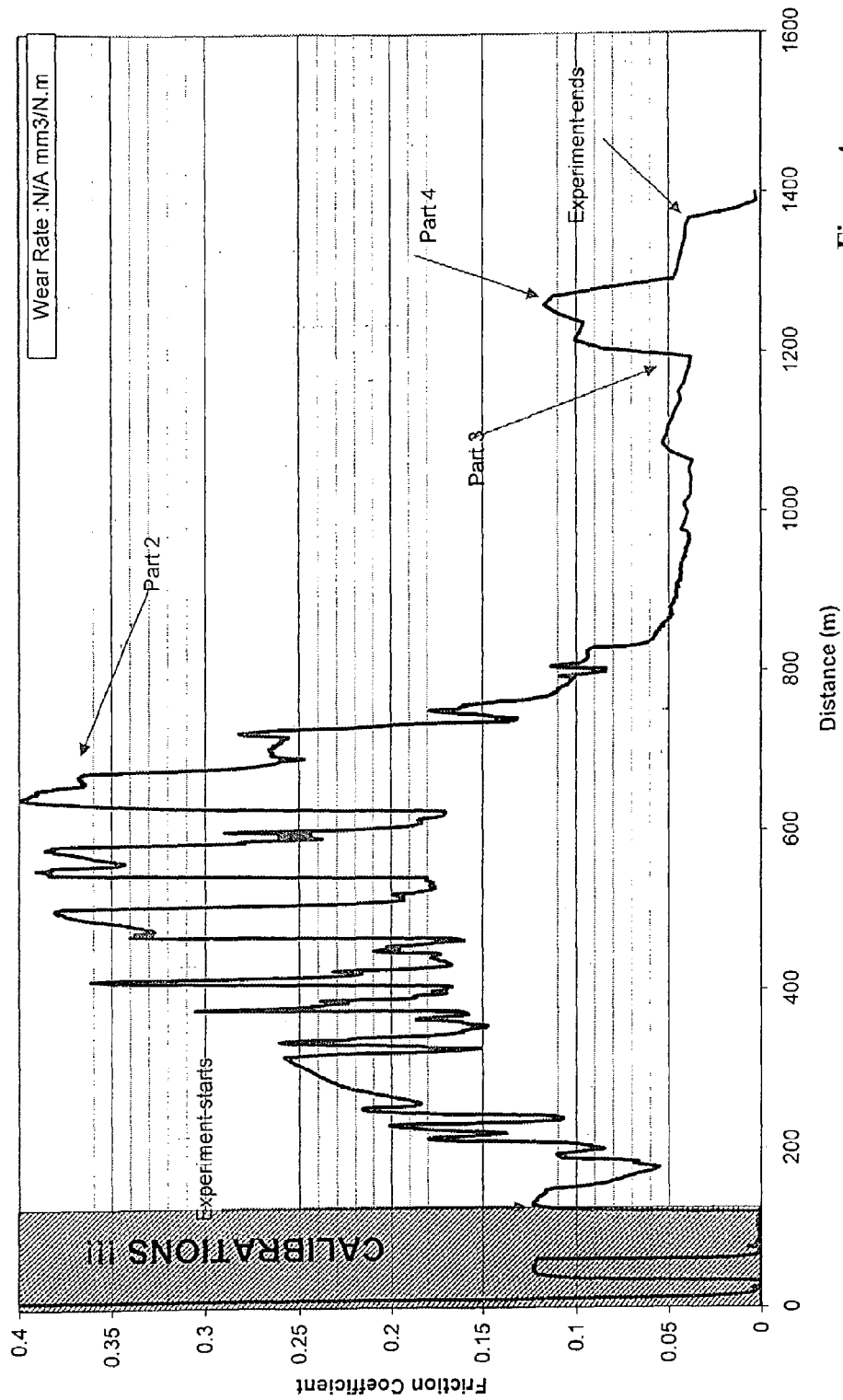
FIG. 4 is a graph comparison of the coefficients of friction under a 10 N load of an NFC (near frictionless coated) ball rolling at 400 rpm on an NFC flat with (Part 3 and Part 4) and without (Part 2) a nitrogen environment (ref. 0. Eryilmaz, Argonne National Laboratory tests).

Referring now to the drawings wherein like numerals designate like and corresponding parts, in FIGS. 1 through 3 are shown disk drives which are exemplary of the present invention. The hard disk drive 10 of FIG. 1 includes a housing 11, a seal 12 for hermetically sealing the housing 11; a usual type of port (not shown) for purging moisture and air and adding hydrogen and an inert gas to the housing 11. The disk drive 12 in FIG. 2 is exemplary of a small floppy disk drive wherein a disk 13 in a hard jacket 14 is manually inserted and removed from a housing 15. A typical optical drive 16 is shown in FIG. 3 wherein an optical disk 17 is manually inserted into a tray 18 and installed and retracted by the tray 18 into a housing 19.

The components inside of the hard drive housing 11 are conventional and include a stack of disks mounted on a common spindle, drive and stepper motors, and magnetic read/write heads attached to common actuators or actuator arms. When the drive is in use, the disks spin and the heads fly in unison across the spinning disks. One distinguishing feature of our invention is that movable mating surfaces of the drive members are coated with a thin film of an ultra low friction and wear structurally amorphous diamond-like carbon coating. A second distinguishing feature is that the digitized surfaces of the disks are coated with a very thin film of the ultra low friction and wear, amorphous carbon film. A third distinguishing feature is that the housing is hermetically sealed and filled with a mixture of nitrogen and hydrogen gas. Another distinguishing feature is that the need for lubricants has been substantially eliminated where the thin film of the ultra low friction and wear amorphous carbon film has been used.

Figure 5:
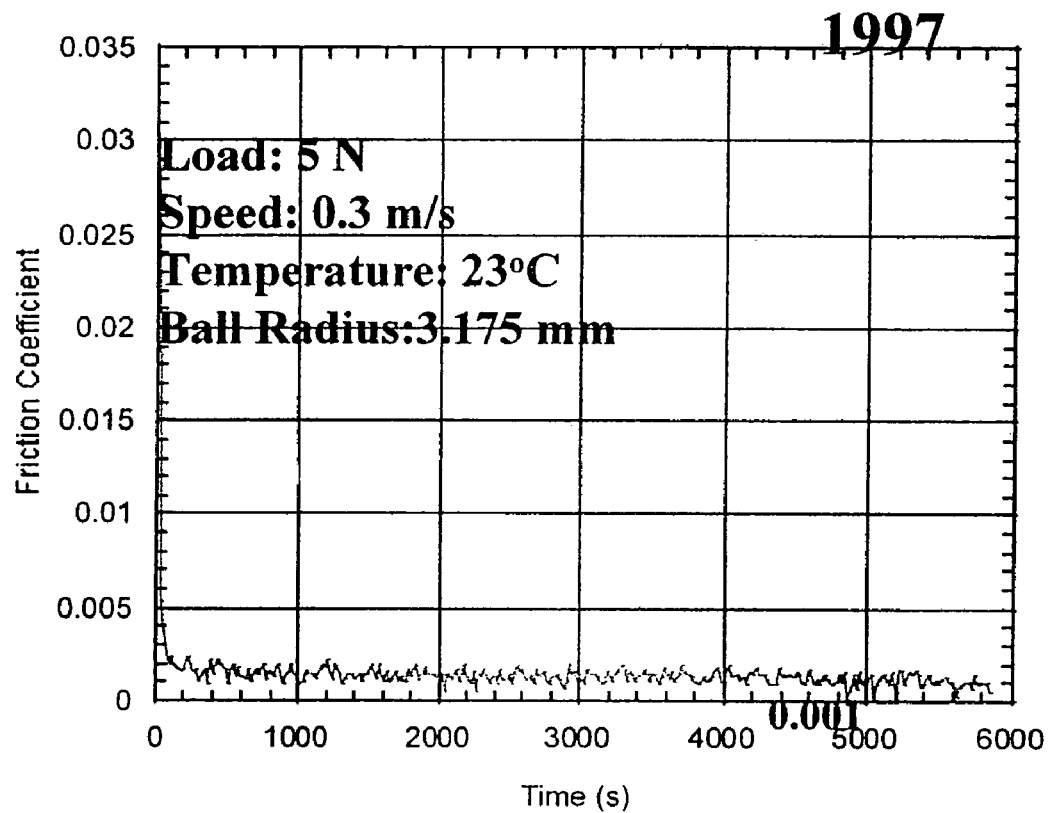
FIG. 5 is a graph revealing the ultra-low coefficient of friction of an NFC coated Sapphire ball against an NFC coated Sapphire disk in a 100% dry nitrogen environment (ref. 0. Eryilmaz, Argonne National Laboratory tests).
Figure 6:
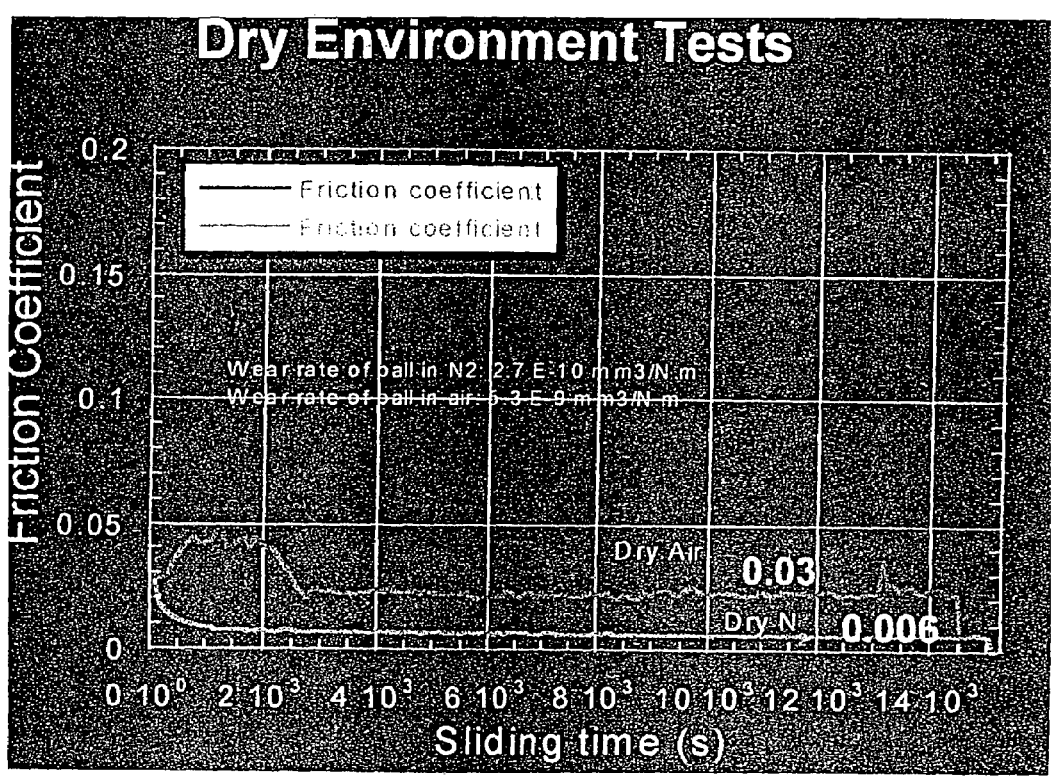
FIG. 6 is a graph comparison of the coefficients of friction of a pin on a disk in dry air and dry nitrogen/hydrogen environments (ref. 0. Eryilmaz, Argonne National Laboratory tests).

The carbon film can be grown from a plasma containing hydrogen and a carbon containing source such as hydrogen rich methane, ethane, ethylene, butane, acetylene or other hydrocarbon discharge plasmas. The preferred plasma contains about 25-95% hydrogen and about 75-5% of the carbon containing source. In a clean, inert gas test environment, such as dry nitrogen or argon, the coefficient of friction of the film has been measured as extremely low, in the range of 0.001 to 0.007 (ref. FIGS. 5 and 6). Low friction results were obtained by an ion beam deposition method using hydrocarbon gases, such as methane and acetylene in particular ratios and by plasma enhanced chemical vapor deposition (PECVD).

An important feature of structurally amorphous carbon film which is disclosed in U.S. Pat. No. 6,548,173 is its extremely low wear rate. When sliding against steel or ceramic, in dry nitrogen or argon, the wear rates were 100 to 1000 times lower than those of Teflon®, molybdenum disulfide and graphite coatings. Another important feature is its extremely low coefficient of friction which is believed to be the lowest reported to date for a solid material.

In terms of durability or wear life, articles containing a thin film of the structurally amorphous carbon exhibited extremely long endurance lives. In a test, the amorphous carbon film about 1 micrometer thick on H13 steel accumulated more than 17.5 million cycles under extreme contact pressures with little detectable wear.

In the preferred embodiment, the digitized surfaces of spinning disks and the moving mating surfaces of disk components, such as the spindle, head, slider, and components of a spindle motor and a stepper motor are coated with thin films of the structurally amorphous carbon in a thickness of about 0.1 to 4 microns. In the case of the hard disk drive 10, the housing 11 of the hard disk is hermetically sealed and purged of moisture and air and filled with a mixture of hydrogen and an inert gas, such as argon or nitrogen.

Although only a single embodiment of our invention has been described, it will be apparent that other embodiments can be developed by changes which are obvious to persons skilled in the art, such as insignificant variations in thicknesses and compositions of materials, obvious substitutions of materials and obvious substitutions in the order and steps in our method without departing from the spirit thereof.

What we claim is new is:

1. A reliable, high performance disk drive for digitizing, storing and retrieving data comprising a housing: at least one disk mounted in said housing; a read/write head for recording and retrieving data on said disk; a thin amorphous carbon film deposited on at least one surface of a pair of mating movable components inside of said housing, said film grown from a plasma containing a mixture of carbon containing gas and hydrogen gas, adjusted such that the atomic molar ratio of carbon to hydrogen is less than 0.3, including all carbon atoms and all hydrogen atoms in said plasma; said film further having a coefficient of friction from 0.001 to 0.007 in a substantially clean lubricantless inert gas environment; and a lubricantless inert gas environment.

2. The reliable, high performance disk drive recited in claim 1 wherein said disk drive is a magnetic disk drive.

3. The reliable, high performance disk drive recited in claim 1 wherein said disk drive is an optical disk drive.

4. The reliable, high performance disk drive recited in claim 1 wherein said housing is a hermetically sealed housing.

5. The reliable, high performance disk drive recited in claim 1 wherein said inert gas is nitrogen gas.

6. The reliable, high performance disk drive recited in claim 1 wherein said inert gas is argon gas.

7. The reliable, high performance disk drive recited in claim 1 wherein said thin structurally amorphous carbon film is derived from hydrogen rich methane, ethane, ethylene, acetylene or other hydrocarbon gas discharge plasmas.

8. The reliable, high performance disk drive recited in claim 1 wherein said thin structurally amorphous carbon film is deposited by ion deposition using hydrocarbon gases, such as methane and acetylene in particular atomic molar ratios of carbon to hydrogen.

9. The reliable, high performance disk drive recited in claim 1 wherein said thin structurally amorphous carbon film is deposited by magnetron sputtering.

10. The reliable, high performance disk drive recited in claim 1 wherein said thin structurally amorphous carbon film has a wear rate from about $10^{-10}$ to $5 \times 10^{11}$ cubic millimeters per Newton meter, measured in a dry, inert lubricantless gas environment.

11. The reliable, high performance disk drive recited in claim 1 further comprising a substrate under said thin structurally amorphous carbon film.

12. The reliable, high performance disk drive recited in claim 1 wherein thin structurally amorphous carbon film is deposited on said substrate by ion-beam deposition.

13. The reliable, high performance disk drive recited in claim 11 wherein thin structurally amorphous carbon film is deposited on said substrate by DC sputtering.

14. The reliable, high performance disk drive recited in claim 11 wherein thin structurally amorphous carbon film is deposited on said substrate by RF sputtering.

15. The reliable, high performance disk drive recited in claim 11 wherein thin structurally amorphous carbon film is deposited on said substrate by plasma enhanced chemical vapor deposition.

16. The reliable, high performance disk drive recited in claim 11 wherein thin structurally amorphous carbon film is deposited on said substrate by laser ablation.

17. The reliable, high performance disk drive recited in claim 1 wherein said thin structurally amorphous carbon film is deposited on a silicon bonding layer.

18. The reliable, high performance disk drive recited in claim 1 wherein said film is deposited on a thin bonding layer.

19. The reliable, high performance disk drive recited in claim 1 wherein said film is about 0.001 to 4 microns thick.

20. The reliable, high performance disk drive recited in claim 1 wherein said structurally amorphous carbon film is comprised of carbon and about 30 to 40 atomic mole percent hydrogen as measured by ion back scattering.

21. A method for increasing the durability, reliability and performance of a magnetic or optical disk drive comprising the steps of applying a thin ultra low friction and wear structurally amorphous carbon film on at least one mating surface of a pair of mating surfaces of said drive, said film having a coefficient of friction in a clean, non-reactive lubricantless test environment within a range of about 0.001 to 0.007 and a wear rate from about $10^{-10}$ to $5\times10^{11}$ cubic millimeters per Newton meter, measured in said dry, inert lubricantless gas environment; hermetically sealing an outer housing of said disk drive; purging said outer housing of moisture and air; filling said outer housing with a dry inert gas; and operating said drive without a lubricant.

22. The method recited in claim 21 wherein said movable component is a disk for storing digitized data.

23. The method recited in claim 21 wherein said component is a spindle for spinning a disk of said disk drive.

24. The method recited in claim 21 wherein said component is a shaft of a motor of said disk drive.

25. A method for increasing the reliability and performance of a magnetic or optical disk drive comprising the steps of applying a bonding material to mating surfaces of movable components of said disk drive; applying an ultra low friction structurally amorphous carbon film to said bonding material of said mating movable members having a coefficient of friction of from 0.001 to 0.007 and a wear rate from about $10^{-10}$ to $5\times10^{11}$ cubic millimeters per Newton meter, measured in a dry, inert gas environment; hermetically sealing an outer housing of said disk drive; purging said disk drive of moisture and air; filling said purged outer housing with an inert gas; and operating said drive without a lubricant.

26. The method recited in claim 25 wherein said thin amorphous carbon film is derived from hydrogen rich methane, ethane, ethylene, acetylene or other hydrocarbon gas discharge plasmas.

27. In a hard disk drive of the class having a housing, a stack of disks mounted on a common spindle; a spindle motor for rapidly spinning said disks; magnetic heads adjacent to said disks and attached to common actuators or actuator arms for flying said heads in unison above said rapidly spinning disks and a stepping motor for moving said heads, a means for improving the performance and reliability of said hard disk drive; said improvement comprising a hermetically sealed outer housing; a thin ultra low friction and ultra low wear structurally amorphous carbon film having a coefficient of friction from 0.001 to 0.007 when measured in a clean nitrogen environment on at least one movable mating surface of said disks, a spindle of said motor, said magnetic heads, said actuators or actuator arms; and an inert gas in the interior of said housing.

28. In a method for manufacturing a floppy disk drive of the class having a magnetic read/write head in contact with a surface of a spinning disk for writing and reading data from a spinning floppy disk, an improvement for improving the performance, durability and reliability of said floppy drive comprising the steps of: depositing a very thin ultra low friction and ultra low wear structurally amorphous carbon film having a coefficient of friction from 0.001 to 0.007 when measured in a clean inert gas environment to a surface of said disk which is in contact with a surface of said magnetic head.

29. The improvement recited in claim 28 further comprising the step of adding said very thin ultra low friction and ultra low wear structurally amorphous carbon film to a surface of said magnetic head which is in contact with said spinning disk.

30. The improvement recited in claim 28 wherein said thin ultra low friction and ultra low wear structurally amorphous carbon film has a thickness which is within a range of about 0.001 to 4 microns.

31. The improvement recited in claim 28 wherein said thin ultra low friction and ultra low wear structurally amorphous carbon film has a wear rate of about $10^{-10}$ to $5\times10^{11}$ cubic millimeters per Newton meter, measured in a dry, inert gas environment.

\* \* \* \* \*